US012621926B2

(12) United States Patent
Citkaya et al.

(10) Patent No.: US 12,621,926 B2
(45) Date of Patent: May 5, 2026

(54) PRINTED CIRCUIT BOARD INCLUDING INTERDIGITAL SLOTS AND/OR SPLITS ON REFERENCE PLANES FOR REDUCING EMI

(71) Applicant: TURKIYE BILIMSEL VE TEKNOLOJIK ARASTIRMA KURUMU, Ankara (TR)

(72) Inventors: Ahmet Yasin Citkaya, Kocaeli (TR); Seyit Ahmet Sis, Kocaeli (TR); Coskun Cosar, Kocaeli (TR); Ekrem Demirel, Kocaeli (TR); Fatih Ustuner, Kocaeli (TR)

(73) Assignee: TURKIYE BILIMSEL VE TEKNOLOJIK ARASTIRMA KURUMU, Ankara (TR)

( * ) Notice: Subject to any disclaimer, the term of this patent is extended or adjusted under 35 U.S.C. 154(b) by 0 days.

(21) Appl. No.: 17/670,399

(22) Filed: Feb. 11, 2022

(65) Prior Publication Data

US 2022/0264739 A1 Aug. 18, 2022

(30) Foreign Application Priority Data

Feb. 12, 2021 (TR) ................................ 2021/002025

(51) Int. Cl.
*H05K 1/00* (2006.01)
*H05K 1/02* (2006.01)

(52) U.S. Cl.
CPC ......... *H05K 1/0227* (2013.01); *H05K 1/0231* (2013.01)

(58) Field of Classification Search
CPC ........................... H05K 1/0227; H05K 1/0231
See application file for complete search history.

(56) References Cited

U.S. PATENT DOCUMENTS

| | | | |
|---|---|---|---|
| 6,349,038 B1 * | 2/2002 | Hailey ................. | H05K 1/0216 |
| | | | 174/394 |
| 6,624,729 B2 * | 9/2003 | Wright .................... | H01P 3/081 |
| | | | 333/4 |
| 7,102,456 B2 * | 9/2006 | Berg ........................ | H01P 3/081 |
| | | | 333/33 |
| 7,183,492 B2 * | 2/2007 | Chao .................... | H05K 1/0218 |
| | | | 361/795 |
| 9,241,400 B2 * | 1/2016 | Shaw .................... | H05K 1/0253 |
| 2002/0084876 A1 * | 7/2002 | Wright ................... | H01P 3/081 |
| | | | 333/1 |
| 2004/0198078 A1 * | 10/2004 | Otaki ................. | H01R 13/6596 |
| | | | 439/76.1 |
| 2007/0235832 A1 * | 10/2007 | Wang ................... | H05K 1/0216 |
| | | | 257/503 |
| 2019/0007259 A1 * | 1/2019 | Yong ................... | H01R 13/6691 |

* cited by examiner

*Primary Examiner* — Pete T Lee

(57) ABSTRACT

The invention is particularly related to design slot and splits on the reference planes of printed circuit boards with an interdigital geometry having conductive fingers protruding from the opposite edges of the slits and/or splits, and placing these conductive fingers in a way that they are intertwined without contacting each other so as to reduce the electromagnetic radiation level originating from the slots and splits, and to preserve the signal integrity.

2 Claims, 8 Drawing Sheets

9.1
9.2
9.3
9.4
9.5
9.6

(a)

9.8
9.2
9.1
9.7
9.9

(b)

(a)

(b)

(a)

(b)

PRINTED CIRCUIT BOARD INCLUDING INTERDIGITAL SLOTS AND/OR SPLITS ON REFERENCE PLANES FOR REDUCING EMI

TECHNICAL FIELD OF THE INVENTION

The invention is related to a method for improving the printed circuit boards (PCBs) in terms of electromagnetic interference (EMI) and signal integrity (SI).

The invention is also related to a method for limiting the electromagnetic radiation sourced from the slots and/or splits patterned on the reference planes of the PCBs for use in separating the different voltage levels and/or also isolating the sensitive RF/analog circuits from the noisy digital circuits.

The invention is particularly related to forming a capacitance to allow high-frequency signals selectively pass through the slot/split in the reference plane by designing these slots and splits in an interdigital (comb) geometry consisting of intertwined fingers in various configurations.

PRIOR ART

Printed circuit boards are composed of superimposed conductive and insulating plane layers on which electronic circuits are produced at low cost and in mass. Modern printed circuits are extremely complex and multifunctional structures and are therefore often made of multilayered structures. A cross-section of a multilayer printed circuit board is given in FIG. 1(a) and a top view is given in FIG. 1(b). As seen in FIG. 1, some layers are used as signal layers (1.1, 1.3, 1.4, 1.6), while some layers are power or ground planes called reference planes (1.2, 1.5). Such a complex printed circuit board contains multiple direct current (DC), digital, analog, and even radio frequency (RF) circuits. This complexity requires creating power or ground islands at different DC voltage levels on the reference plane. Digital circuits are more tolerant to noise than analog and RF circuits, and even such circuits are noise sources themselves. A typical approach to separate sensitive analog and RF circuits in printed circuit boards from noisy digital circuits is to create islands or peninsulas by placing slots or splits between the reference planes of each circuit. In FIG. 1(b), the split (1.7) and slot (1.8) structures are shown in the reference plane (1.2) on the second layer. Due to the complexity and compact nature of the card, a signal path in the upper or lower signal layer may have to cross these slots and splits perpendicularly. Therefore, unwanted electromagnetic radiation is generated due to the return currents flowing from the edges of the slots and splits.

The representation of the slots created in various configurations for isolation on the reference plane in a printed circuit in the current technique and on which stitching capacitors are used in different numbers and at different positions is given in FIG. 2 for an example two-layer printed circuit board (2). In FIG. 2, a signal path (2.1) in the signal layer passes over the slot (2.2) on a reference plane in the lower or upper layer, intersecting the slot at right or different angles. The slot (2.2) here creates an inductive impedance on the path of the return current flowing on the reference plane, limiting the noise current to flow over the ground line. The reason why this inductive impedance occurs is that the return current does not flow directly under the microstrip signal line (2.1) but completes its loop by wrapping around the slot (2.2). However, the current flowing through this extended path increases the electromagnetic radiation. To provide a low impedance path for the signal return current and reduce the electromagnetic radiation from the slot (2.2), one or more stitching capacitors (2.3) are placed at various positions on the reference plane to connect the two edges of the slot (2.2). Different shaped slot geometries are also possible, such as zigzag slot (3.2) designs. Stitching capacitors (3.3) are used to reduce the electromagnetic radiation level in such slots with different geometries.

Again, in the current technique, the representation of the splits, created for the same purpose and on which stitching capacitors are used, is given in FIG. 3 for an example two-layer printed circuit board (4). In FIG. 3, a signal path (4.1) in the signal layer passes over the split (4.2) on a reference plane in its lower or upper layer, at right or different angles. The split (4.2) here divides the reference plane completely into two pieces. Here, although the return current can not complete its path on the reference plane directly on the conductor due to the discontinuity formed by the split (4.2), it completes its path as a displacement current due to the capacitive effect on the split (4.2) at the high frequencies. Because of this discontinuity in the return current, current flows along the edge of the split, which increases the level of electromagnetic radiation. To provide a low impedance path for the signal current and reduce the electromagnetic radiation caused by the existence of the split (4.2), one or more stitching capacitors (4.3) are placed at various positions on the reference plane to connect the two edges of the split (4.2). Split geometries of different shapes, for example, zigzag split designs (5.2), are also possible. Stitching capacitors (5.3) are used to reduce the electromagnetic radiation level in such splits with different geometries as well.

In the aforementioned current art, stitching capacitors selected at suitable values in the slots (2.2, 3.2) and splits (4.2, 5.2) form a low impedance capacitive path for the return current at the signal's frequency/frequency ranges. This, in turn, reduces the level of unwanted electromagnetic radiation from the printed circuit due to the existence of the slots and splits and preserves the integrity of the signal. In summary, one of the important solution methods for the electromagnetic interference problem caused by slots and splits in the current art is to put stitching capacitors on the slot and split. However, the use of stitching capacitors increases the cost and may cause a drop in the signal level due to the losses of the capacitors themselves. In addition, the parasitic inductance of the capacitors prevents the decrease of the impedance at high frequencies and increases the radiation effect. Finally, since these stitching capacitors form a vertical hump on the reference plane, they may pose a disadvantage in the mechanical integration of the PCB into the system.

In another current technique shown in FIG. 4, the gaps in the slots and splits on the reference plane for a two-layer printed circuit board (6,7) are filled with materials with a high dielectric constant (6.2, 7.2). This increases the level of capacitive coupling between the edges of the slots and splits, thereby reducing the impedance on the path through which the return current flows. As a result, the level of electromagnetic radiation originating from slots and splits is reduced. However, fabrication complexity and cost are some of the most important disadvantages of this current technique.

Finally, another existing technique used to limit electromagnetic interference in printed circuits is to screen the printed circuit board with a conductive layer. Screened printed circuit boards with slots and splits in their reference planes are shown in FIG. 5. Here, the screen (8) is essentially a metal box, and it aims to limit the electromagnetic radiation emitted from the printed circuit to the outside of the box and to prevent the transmission of electromagnetic waves coming from the outside into the box containing the printed circuit. Since the current shielding technique also increases the cost and volume, its application in some cases causes a major disadvantage.

As a result, the above-mentioned problems that could not be solved in the light of the current technique made it necessary to make an innovation in the relevant technical field.

AIM OF THE INVENTION

The proposed invention relates to printed circuits utilizing slots and/or splits in interdigital structure in order to eliminate the disadvantages mentioned above and to bring new advantages to the related technical field.

The invention aims to design novel interdigital slot structures for isolation on the reference plane, to reduce the electromagnetic radiation level originating from the slots compared to conventional slit structures.

Another aim of the invention is to design novel interdigital split structures for isolation on the reference plane and to reduce the electromagnetic radiation level originating from the splits, compared to conventional split structures.

Another aim of the invention is to create a low impedance path for the return current at the desired frequency ranges, by increasing the distributed capacitance value between the two edges of the slots and splits with the interdigital structure.

Another aim of the invention is to protect the signal integrity and quality by providing a low impedance path for the return current in the reference plane at the frequencies of the signal while protecting the noise isolation by exhibiting sufficient impedance at other frequencies.

BRIEF DESCRIPTION OF THE INVENTION

To achieve all the objectives mentioned above and which will also be detailed below, the present invention is a reference plane with slots and/or splits designed to limit electromagnetic interference, protect signal integrity/quality, and provide isolation and, contain interdigital slots and/or splits on the reference plane(s)

contain additional stitching capacitor or capacitors are added on the interdigital structure to further reduce the radiation and further increase the signal integrity be capable of accommodating multiple interdigital slots and splits on the same reference plane be able to accommodate multiple slots and splits in both interdigital and conventional and/or other geometries on the same reference plane contain one or more stitching capacitors at different positions in these different slots and splits.

In this regard, the reference plane of the printed circuit board contains single or multiple numbers of interdigital slots and/or splits, and/or also contains stitching capacitors on these slots and or splits.

To better understand the embodiment of the present invention and its advantages, this brief description should be evaluated together with the figures described below.

DESCRIPTIONS OF THE REFERENCES IN THE FIGURES

Figure 1:
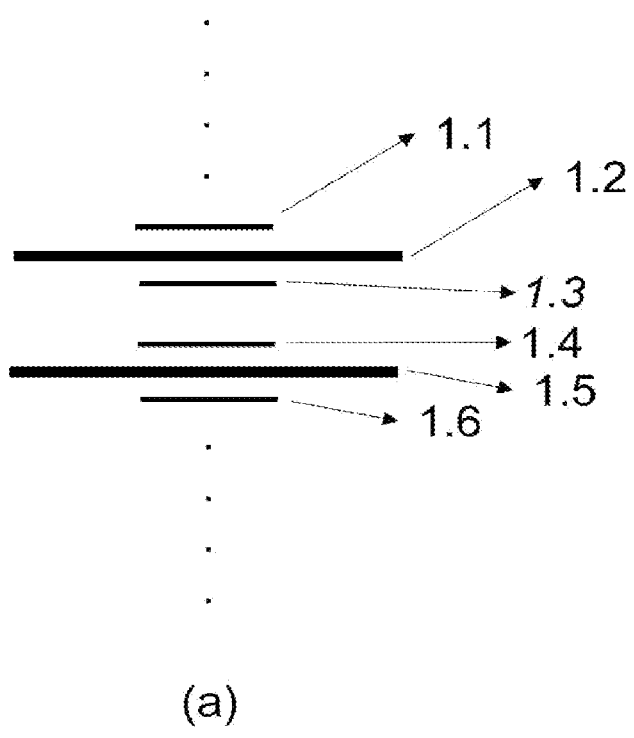
FIG. 1 is a cross-sectional view and a top view of an exemplary printed circuit board that is multilayered and capable of having slots/splits in the reference planes.
Figure 1:
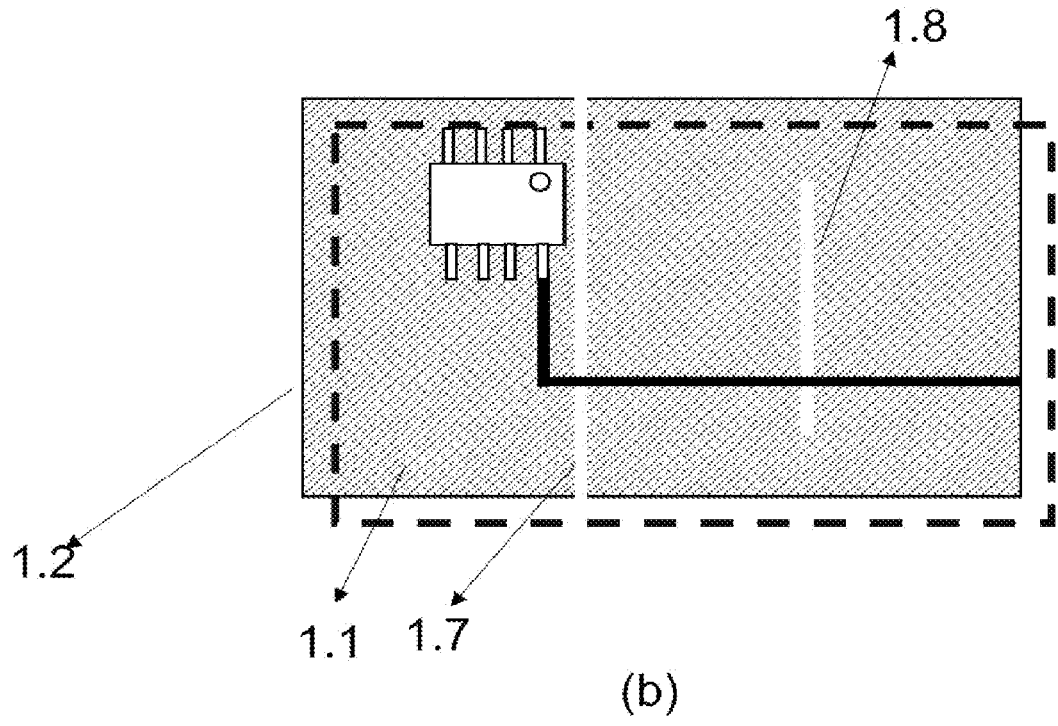
Figure 2:
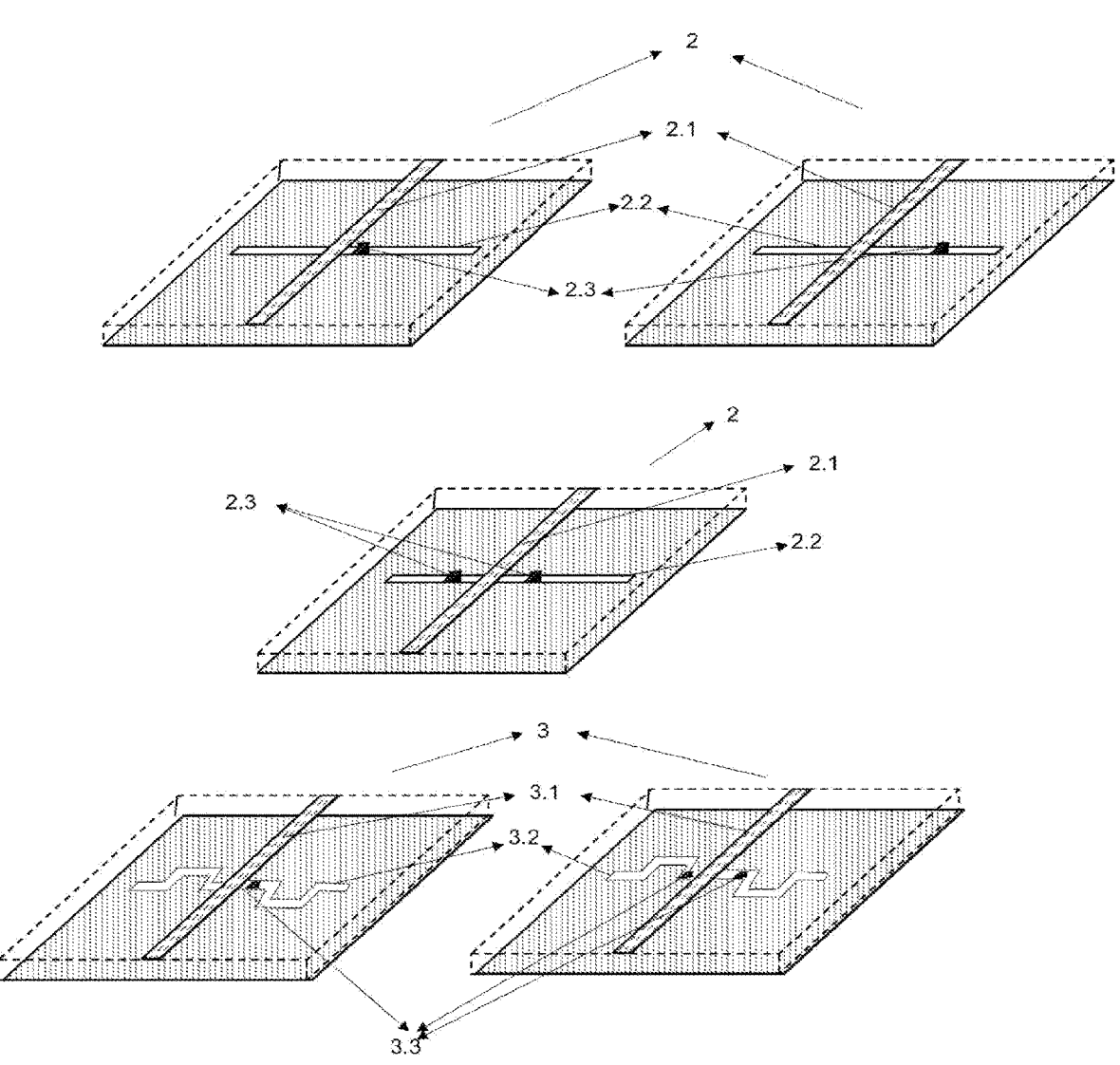
FIG. 2 is the view of conventional slot shapes with stitching capacitors placed on the reference plane in the state of the art.
Figure 3:
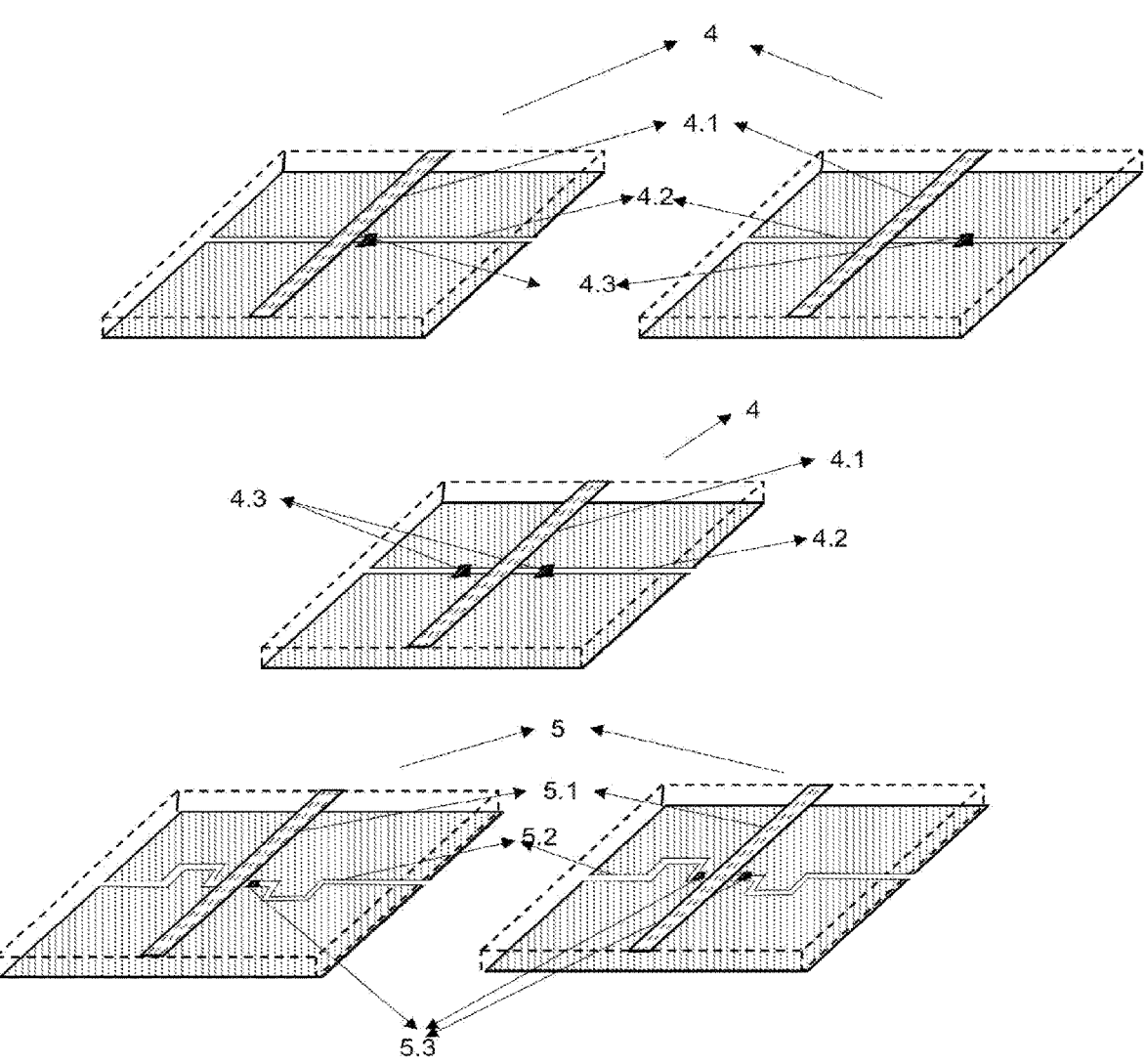
FIG. 3 is the view of conventional split shapes with stitching capacitors placed on the reference plane in the state of the art.
Figure 4:
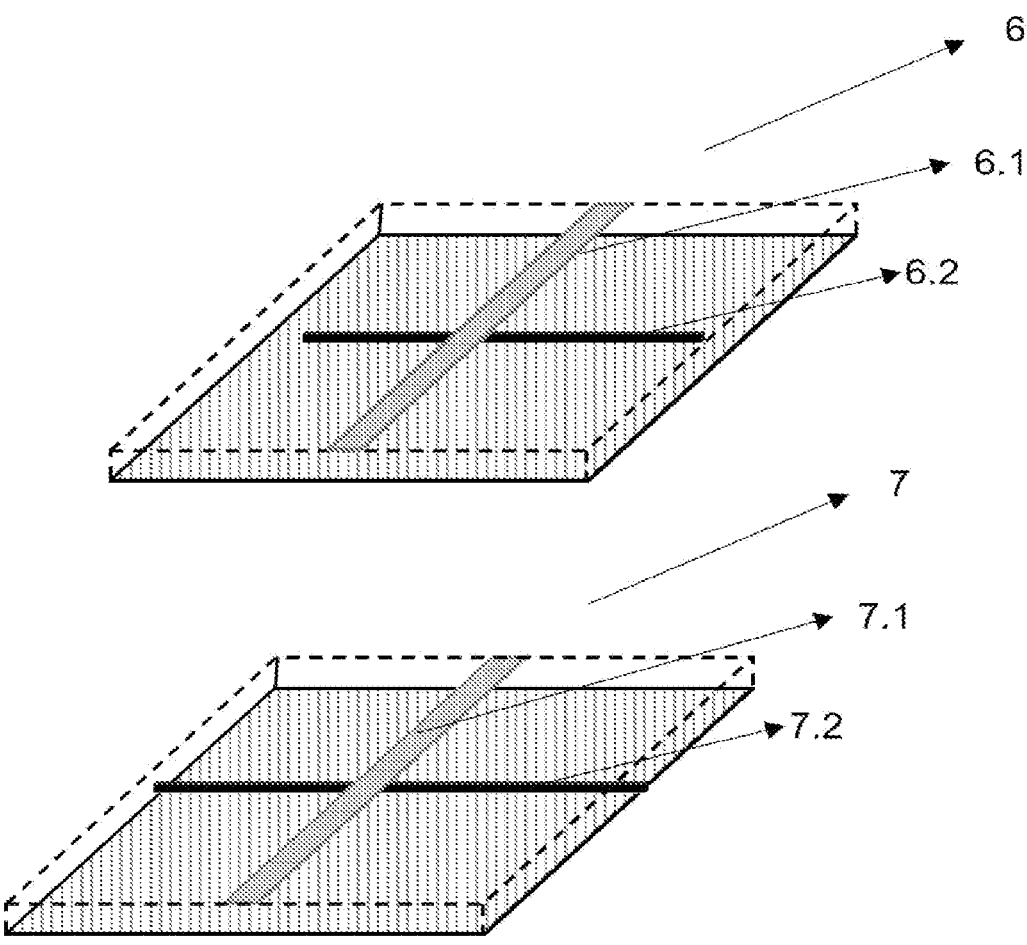
FIG. 4 is the view of conventional slot and split shapes placed on the reference plane in the state of the art and the gap on them filled with high dielectric materials.
Figure 5:
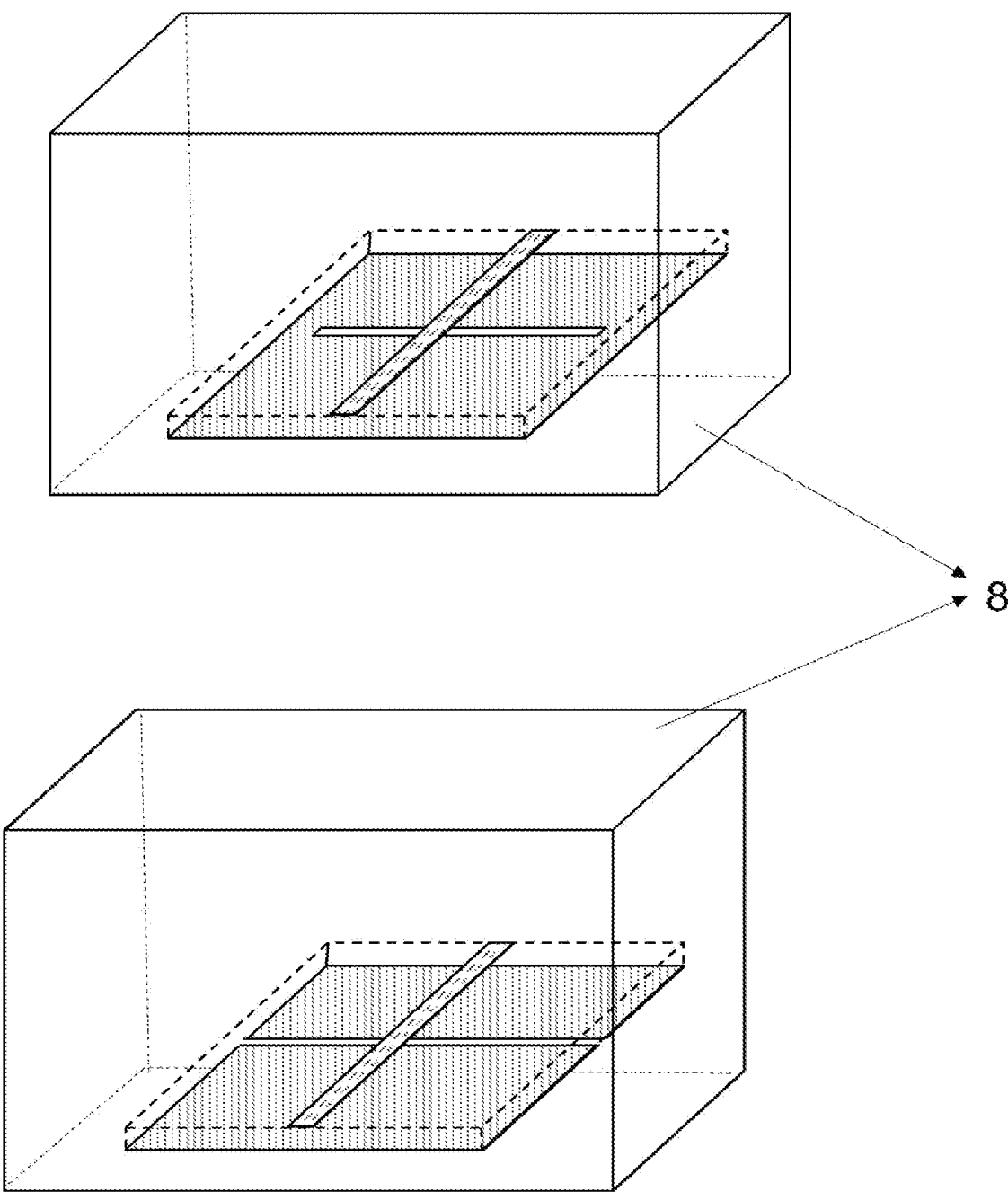
FIG. 5 is the image of screened printed circuits containing slots and splits placed on the reference plane in the state of the art.

1. Multilayer printed circuit board
    1.1. First layer from the top, the signal layer
    1.2. Second layer from the top, the reference plane
    1.3. Third layer from the top, signal layer
    1.4. The fourth layer from the top, the signal layer
    1.5. Fifth layer from the top, the reference plane
    1.6. The sixth layer from the top, the signal layer
    1.7. Example conventional split structure on the reference plane
    1.8. Example conventional slot structure on the reference plane
2. Two-layer printed circuit board with a signal line in the upper signal layer, a slot on the lower reference plane, and one or more stitching capacitors on the slot
    2.1. A signal line in the upper signal layer
    2.2. A conventionally constructed slot on the lower reference plane
    2.3. Stitching capacitor or capacitors, joining the two edges of the slot, on the slot in the lower reference plane
3. Two-layer printed circuit board with a signal line on the upper reference plane a zigzag slot on the lower reference plane and one or more stitching capacitors on the slot
    3.1. A signal line in the upper signal layer
    3.2. A zigzag-shaped slot of conventional construction in the lower reference plane
    3.3. Stitching capacitor or capacitors joining the two edges of the slot on the slot in the lower reference plane
4. Two-layer printed circuit board with a signal line on the upper signal layer a split on the lower reference plane and one or more stitching capacitors on the discrete
    4.1. A signal line in the upper signal layer
    4.2. A conventional split in the lower reference plane
    4.3. Stitching capacitor or capacitors joining the two edges of the split on the split in the lower reference plane
5. Two-layer printed circuit board with a signal line in the upper reference plane, a zigzag split in the lower reference plane, and one or more stitching capacitors on the discrete 5.1. A signal line in the upper signal layer 5.2. A zigzag-like split in the lower reference plane of the conventional construction.

5.3. Stitching capacitor or capacitors joining the two edges of the split on the split in the lower reference plane 6. A signal line in the upper mark layer, a split in the lower reference plane, and a dielectric material in the space above the spot 6.1. A signal line in the upper signal layer 6.2. A conventionally constructed split in the lower reference plane, above which the cavity is filled with a material with high dielectric constant 7. A signal line in the upper signal layer, a split in the lower reference plane, and a dielectric material in the space above the split 7.1. A signal line in the upper signal layer 7.2. A conventional split space in the lower reference plane, on which the cavity is filled with a material of high dielectric constant.

8. Screened box in which the printed circuit board is placed

9. The multilayer printed circuit of the present invention with interdigital splits and splits in the reference planes 9.1. First layer from the top, signal layer 9.2. Second layer from the top, the reference plane 9.3. Third layer from the top, signal layer 9.4. The fourth layer from the top, the signal layer 9.5. Fifth layer from the top, the reference plane 9.6. The sixth layer from the top, the signal layer 9.7. Interdigital split structure proposed in the invention on the reference plane 9.7.1. Finger structure in interdigital splits 9.8. Interdigital slot structure proposed in the invention on the reference plane 9.8.1. Finger structure in interdigital slots 9.9. Stitching capacitor placed on interdigital slots or splits

DETAILED DISCLOSURE OF THE INVENTION

Figure 6:
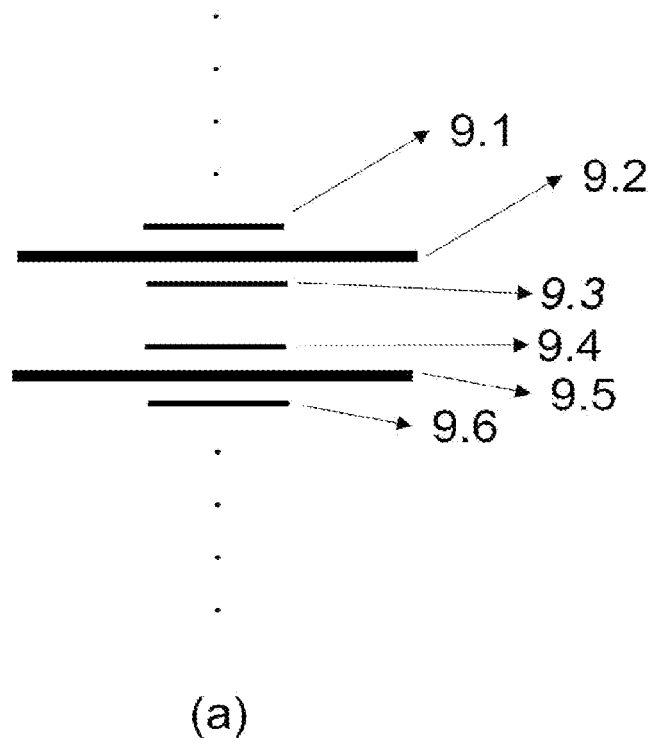
FIG. 6 is a cross-section and top view of a multilayer printed circuit proposed in the present invention, which has interdigital slots and splits on the reference planes.
Figure 6:
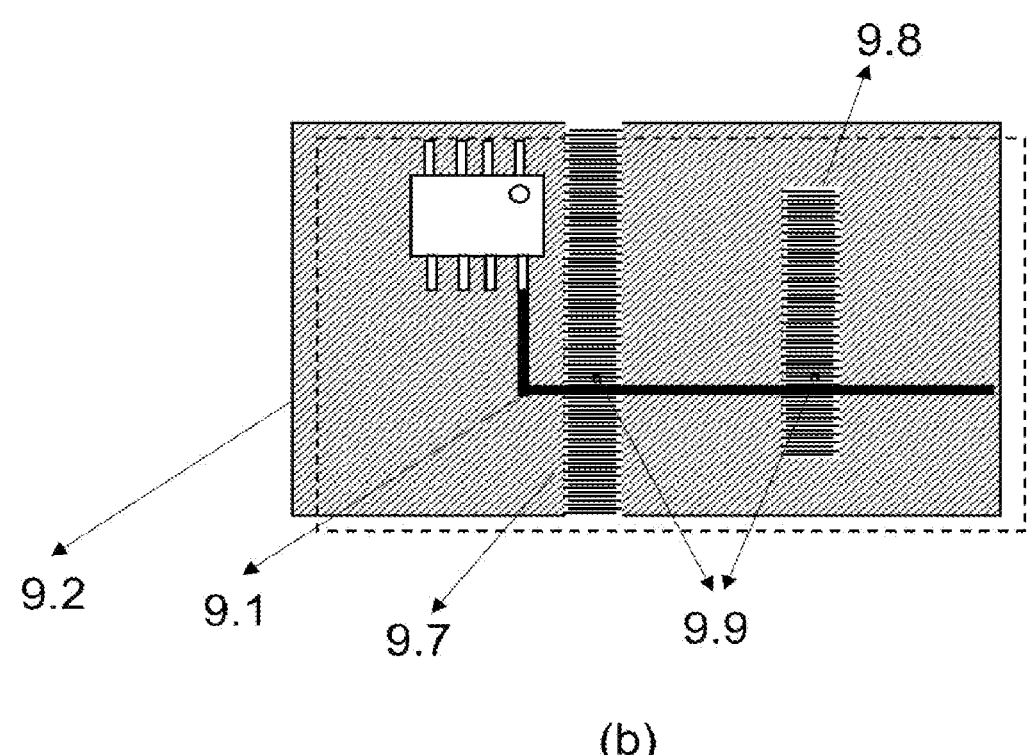
Figure 7:
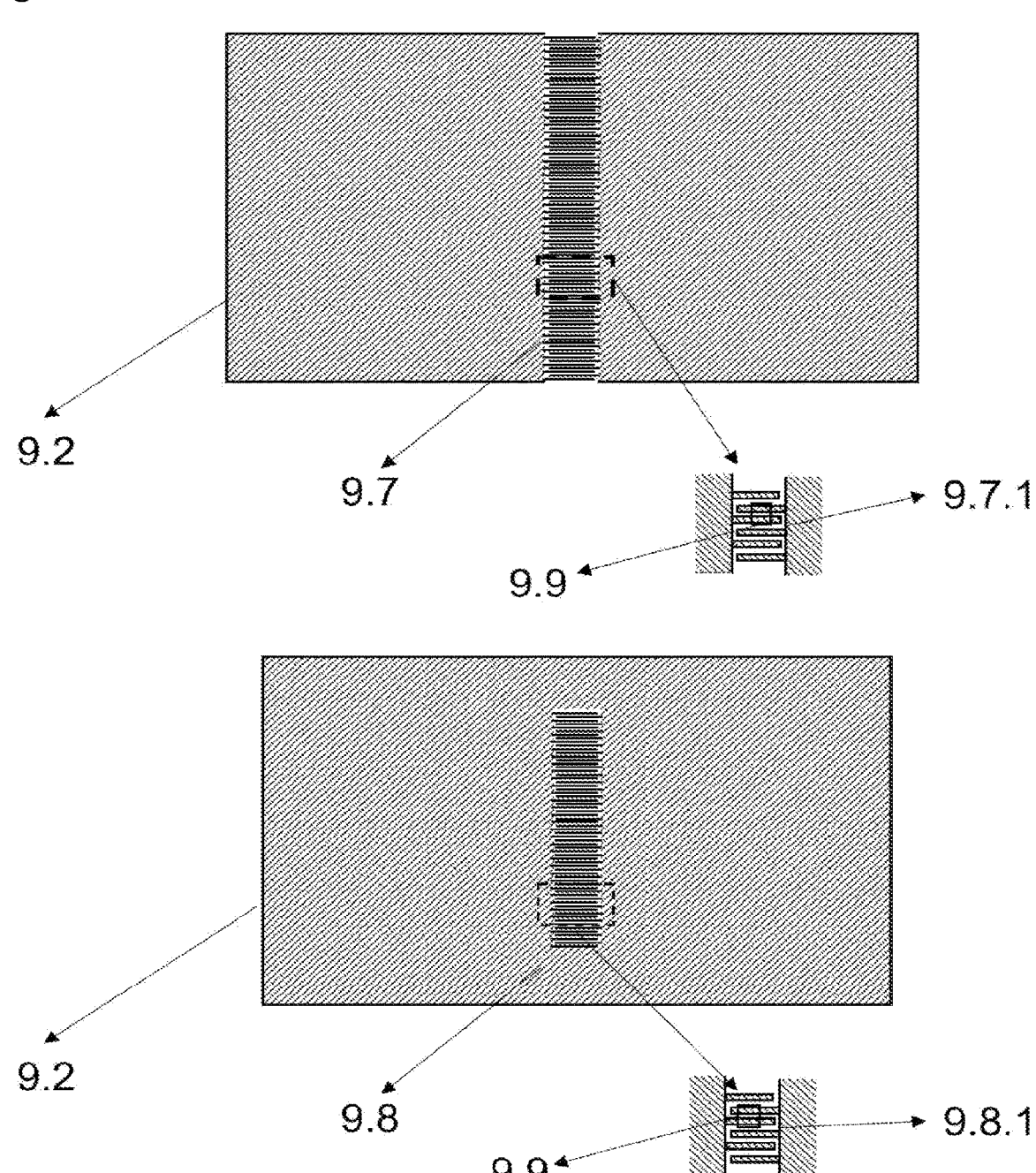
FIG. 7 is a detailed and zoomed-in view of the interdigital slot and split structures proposed in the present invention.

In this detailed explanation, the innovation that is the subject of the invention is only explained with examples that will not have any limiting effect for a better understanding of the subject. A cross-sectional view of a multilayer printed circuit board consisting of power and ground planes, called reference planes, and signal layers, is given in FIG. 6(*a*). FIG. 6(*b*) shows only the top view of the top two layers of this multi-layer printed circuit, in which slot or split structures in an interdigital form are used for noise isolation on the power or ground plane or for separating different DC voltage levels from each other. The invention was developed to reduce the level of electromagnetic radiation originating from slots and is a printed circuit board system containing;

a printed circuit board with two or more layers one or more signal layers on the printed circuit board one or more reference planes on the printed circuit board one or more number of interdigital slots and/or splits on any of the reference planes stitching capacitors on interdigital slots and/or splits depending on the requirements and a metallic box containing this printed circuit board system for electromagnetic shielding depending on the requirements.

The purpose of adding a stitching capacitor (9.9) on the interdigital slot and/or split structure, if necessary, is to further reduce the electromagnetic radiation level to protect the signal integrity better by lowering the slot and/or split impedance in the desired frequency ranges. In addition, the purpose of shielding the printed circuit board with a conductive layer or placing it in the shielding box is to further limit the electromagnetic radiation emitted from the printed circuit board.

The interdigital slot on the reference plane contains (9.8); intertwined fingers (9.8.1), which does not completely physically divide the reference plane, and which leads the return current loop around it by forming a discontinuity on the return current path causing an increase in the impedance on the return current path.

The interdigital split on the reference plane contains (9.7); intertwining conductor fingers (9.7.1) that completely divide the reference plane, preventing the return current from flowing through a conductor, thereby increasing the impedance, and creating a discontinuity on the path of the return current flowing over the reference plane.

Figure 8:
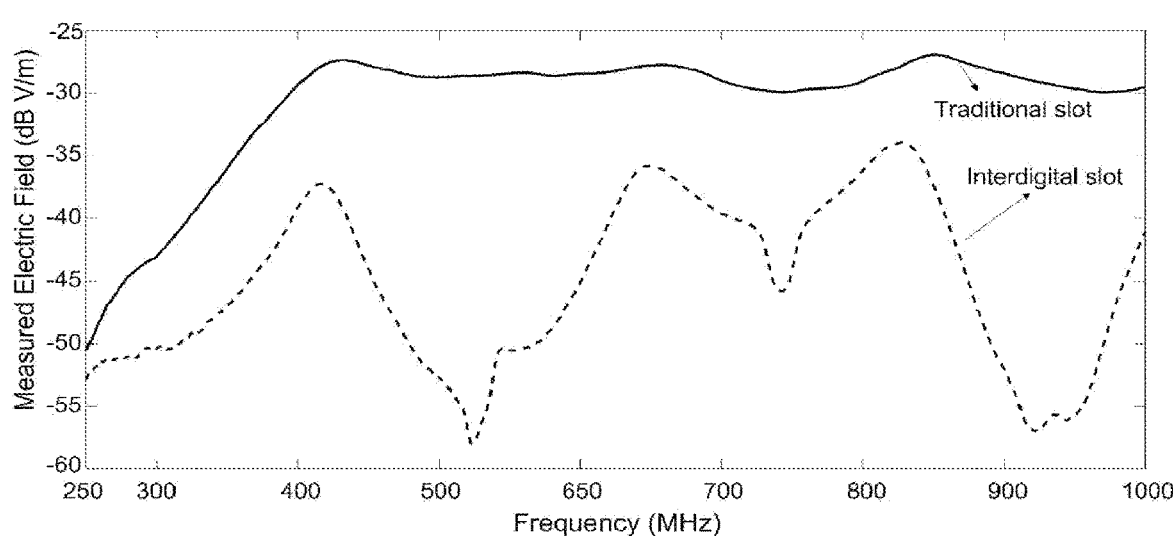
FIG. 8 is the measurement results of electromagnetic wave emitted from an interdigital slotted PCB produced in the present invention and a conventional slotted PCB measured 3 m away from the cards.

The fingers (9.7.1, 9.8.1) coming out from opposite sides in the interdigital structure increase the capacitance value between these two edges. This allows the interdigital slot to exhibit lower impedance within a certain frequency range compared to the normal slot, allowing more of the return current to complete its loop through a shorter path as a displacement current, thanks to the capacitance formed between the two edges, instead of touring around the slot at these frequencies. As a result, the isolation slits produced in the interdigital structure reduce the electromagnetic radiation and protect the signal integrity more than the traditional slot structure. FIG. 8 shows the graph that gives the electric field strength measured from 3 m away from two printed circuit boards with a conventional slot structure and an interdigital slot structure in the reference plane and in which the signal line with 50 ohm impedance from the upper signal layer cuts the slots at right angles. Here, a 0 dBm (1 mW) power level, at frequencies between 250 MHz and 1 GHz, is applied to the input of the 50 ohm line. In that printed circuit board with that interdigital slot, the gap between the fingers and between the finger and the edge was kept 0.5 mm.

In the interdigital split structure, unlike the slot structure, the return current cannot find a way to complete itself over the conductor on the reference plane. The return current completes itself as a displacement current on the capacitance formed between the two edges. Thanks to the fingers in the interdigital split structure, since the length of the two opposite sides facing each other increases, the increase in the capacitance value decreases the impedance and increases the displacement current. As a result, isolation produced in interdigital structure reduces electromagnetic radiation within a certain frequency range and to a certain extent compared to the traditional split structure and preserves the signal integrity better.

INDUSTRIAL APPLICATION OF THE INVENTION

In the printed circuit of the invention, to separate different voltage levels from each other and to provide noise isolation, the slots and/or splits formed on the reference plane (ground or power supply plane) are configured in an interdigital geometry, with intertwining fingers extending towards each other from the opposite edges oft he slot/split. Thanks to the interdigital structure, the capacitance value between the opposing edges of the slots and/or splits is increased, creating a low-impedance path for the return current within a certain frequency range, thus preserving the signal integrity by reducing the unwanted electromagnetic radiation originating from the slots and/or splits. Depending on the need, it is possible to add stitching capacitors in the desired position and number on the slots and/or splits in the interdigital structure to further reduce the electromagnetic radiation level by lowering the impedance of return current path at a certain frequency range and to further limit the electromagnetic radiation emitted from the printed circuit. The printed circuit board can also be shielded with a conductive layer or box.

The invention claimed is:

1. A printed circuit board that limits electromagnetic radiation and preserves signal integrity by reducing unwanted electromagnetic radiation comprising
    at least a signal layer of the printed circuit board, and
    at least a reference plane on another layer of the printed circuit board
wherein the printed circuit board comprises:
    at least one slot (9.8) in an interdigital structure consisting of intertwining conductive fingers (9.8.1) protruding from their opposite edges wherein the fingers coming out from opposite sides in the interdigital structure increase the capacitance value between the two edges, allowing the interdigital slot to exhibit lower impedance within a certain frequency range compared to a normal slot, thereby allowing more of the return current to complete its loop through a shorter path as a displacement current instead of touring around the slot, and wherein the interdigital slot on the reference plane and the signal line are perpendicularly oriented to one another.

2. A printed circuit board that limits electromagnetic radiation and preserves signal integrity by reducing unwanted electromagnetic radiation comprising;
    at least two reference planes on two different layers of the printed circuit board,
wherein at least one of the layers comprises:
    at least one slot (9.8) in the form of an interdigital structure consisting of intertwining conductive fingers (9.8.1) protruding from their opposite edges, wherein the length of the two opposite sides facing each other increases due to the interdigital structure, and this increase in the capacitance decreases the impedance and increases the displacement current, thereby reducing electromagnetic radiation within a certain frequency range;
    and
wherein at least a signal layer between any two of the adjacent reference planes, and the interdigital slot on the reference plane and the signal line are perpendicularly oriented to one another.

* * * * *